(12) United States Patent
Moore et al.

(10) Patent No.: US 7,065,137 B2
(45) Date of Patent: Jun. 20, 2006

(54) DIFFERENCE MESSAGING PROTOCOL THAT USES PRIOR STATE INFORMATION

(75) Inventors: Keith E. Moore, Santa Clara, CA (US); Evan Kirshenbaum, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 755 days.

(21) Appl. No.: 10/056,659

(22) Filed: Jan. 24, 2002

(65) Prior Publication Data

US 2003/0138041 A1    Jul. 24, 2003

(51) Int. Cl.
*H04B 1/66* (2006.01)
(52) U.S. Cl. ....................................................... 375/240
(58) Field of Classification Search ................ 375/240, 375/130, 135, 136
See application file for complete search history.

(56) References Cited

U.S. PATENT DOCUMENTS

| 4,628,344 | A | * | 12/1986 | Glenn | 375/240.25 |
| 4,665,436 | A | * | 5/1987 | Osborne et al. | 348/400.1 |
| 4,754,336 | A | * | 6/1988 | Nishizawa | 358/426.03 |
| 4,868,658 | A | * | 9/1989 | Coleman et al. | 375/240.25 |
| 5,450,132 | A | * | 9/1995 | Harris et al. | 375/240.12 |
| 6,006,254 | A | * | 12/1999 | Waters et al. | 709/205 |
| 6,711,546 | B1 | * | 3/2004 | Thomas | 704/500 |
| 6,789,128 | B1 | * | 9/2004 | Harrison et al. | 709/246 |
| 2003/0149526 | A1 | * | 8/2003 | Zhou et al. | 701/123 |

FOREIGN PATENT DOCUMENTS

| JP | 55128928 A | * | 10/1980 |
| JP | 2000350213 A | * | 12/2000 |

* cited by examiner

*Primary Examiner*—Chieh M. Fan
*Assistant Examiner*—Jia Lu

(57) ABSTRACT

A messaging system that reduces communications bandwidth is disclosed. Difference messages are constructed at a sender from a message and prior state information. The difference messages include information describing the difference between the content of the message and a portion of prior state information, such as a prior message. The difference messages, including a prior message identifier, are sent to the receiver in place of the message. The message is reconstructed at the receiver using the corresponding difference message and the prior state information stored at the receiver. If the message reconstruction is unsuccessful, the sender is notified, and further required information is sent to the receiver.

10 Claims, 6 Drawing Sheets

DIFFERENCE MESSAGING PROTOCOL THAT USES PRIOR STATE INFORMATION

FIELD OF THE INVENTION

This present invention relates to the field of messaging, and more particularly to messaging techniques that encode messages in a distributed environment.

BACKGROUND OF THE INVENTION

A distributed application, or service, is composed of many components running on different computer nodes in a network. Components in a distributed system communicate by sending messages. The message size affects overall network performance by consuming network resources and available bandwidth, and thus limiting the throughput of the network. Because of this, many distributed systems employ methods to increase the information density and reduce the size of transferred messages.

One solution to reduce message sizes employs compression technology. Useful non-image based message compression techniques are generally lossless, so that the original content of the messages are received. Lossless compression techniques are exquisitely sensitive to internal redundancy in a message and often compress data only by 10–20%. Lossy compression techniques may be employed to improve compression ratios. Examples of lossy compression techniques are JPEG/MPEG compression techniques. JPEG/MPEG compression techniques may be applied to data that is arranged in frames (e.g., frames of video pictures). To compress a message containing multiple frames, JPEG/MPEG compression techniques use prior frames to reduce the amount of information necessary to represent subsequent frames. These techniques are capable of compression ratios much greater than ten. However, JPEG/MPEG compression technology is lossy (i.e., the decoded message is not identical to the original message), and thus is unsuitable for certain applications that require lossless messaging. In addition, the use of JPEG/MPEG compression requires sending image data in a predetermined image format. While JPEG and MPEG do use prior state information to reduce encoding of subsequent frames, these techniques are lossy (i.e., information is usually lost in encoding) and are employed for image data A windowing protocol for TCP/IP uses prior state information as a failure mechanism. In this protocol, a party (e.g., client) sends messages, organized into packets, to a second party (e.g., server), and the server sends an acknowledgement to identify those bytes received (i.e., the server identifies the window of bytes received). For example, the client may send 10 bytes of a message to a server, and the server may acknowledge, to the client, receiving a portion of the message. For this example, the client sends only the unreceived portion of the message to the server to recover from the failure as opposed to the entire message. However, in the windowing protocol, prior state information is only used to identify bytes not received or recovered at the receiving party.

There is therefore a need in the art for an improved method for sending messages suitable for business applications. As described herein, the messaging system of the present invention: (1) reduces the size of messages sent so as to increase message throughput; (2) yields a high compression ratio; and (3) reproduces the original uncompressed message at the receiver.

SUMMARY OF THE INVENTION

This disclosure is directed towards a high-throughput messaging system. In some embodiments of the invention, difference messages are constructed from information intended for a receiver and prior state information. In one embodiment, a difference message includes information describing the difference between the content of a current message and a portion of prior state information, such as a prior message. The difference message, which includes a prior message identifier, is sent to the receiver. The current message is then reconstructed at the receiver using the corresponding difference message and the prior state information stored at the receiver. If the current message to reconstruction is unsuccessful, the sender is notified, and further required information is sent to the receiver.

This messaging system is applicable to a wide range of distributed services, and it efficiently reduces the size of messages between components of a distributed system.

BRIEF DESCRIPTION OF THE DRAWINGS

The objects, features, and advantages of the present invention will be apparent to one skilled in the art, in view of the following detailed description in which.

DETAILED DESCRIPTION

A technique for high throughput messaging is disclosed. In the following description, for purposes of explanation, specific nomenclature is set forth to provide a thorough understanding of the invention. However, it will be apparent to one skilled in the art that these specific details are not required in order to practice the invention. In other instances, well-known structures and devices are shown in block diagram form in order not to obscure the description of the invention with unnecessary detail.

HIGH THROUGHPUT MESSAGING EMBODIMENTS

Message throughput is increased by reducing the size of messages sent from a sender to a receiver. Message size is reduced by removing, at the sending party, message content that is already available at a receiving party. In some embodiments of the invention, a difference message is constructed from the difference between information the sending party desires to send to the receiving party and prior state information available at both the sending party and the receiving party. In this way, the difference message includes the difference between the content of a new message and a portion of prior state information, such as a prior message transmitted from the sending party to the receiving party. In one embodiment, the difference message includes a prior state identifier to identify the prior state information to the receiving party (e.g., a reference identifier or a time stamp).

Figure 1:
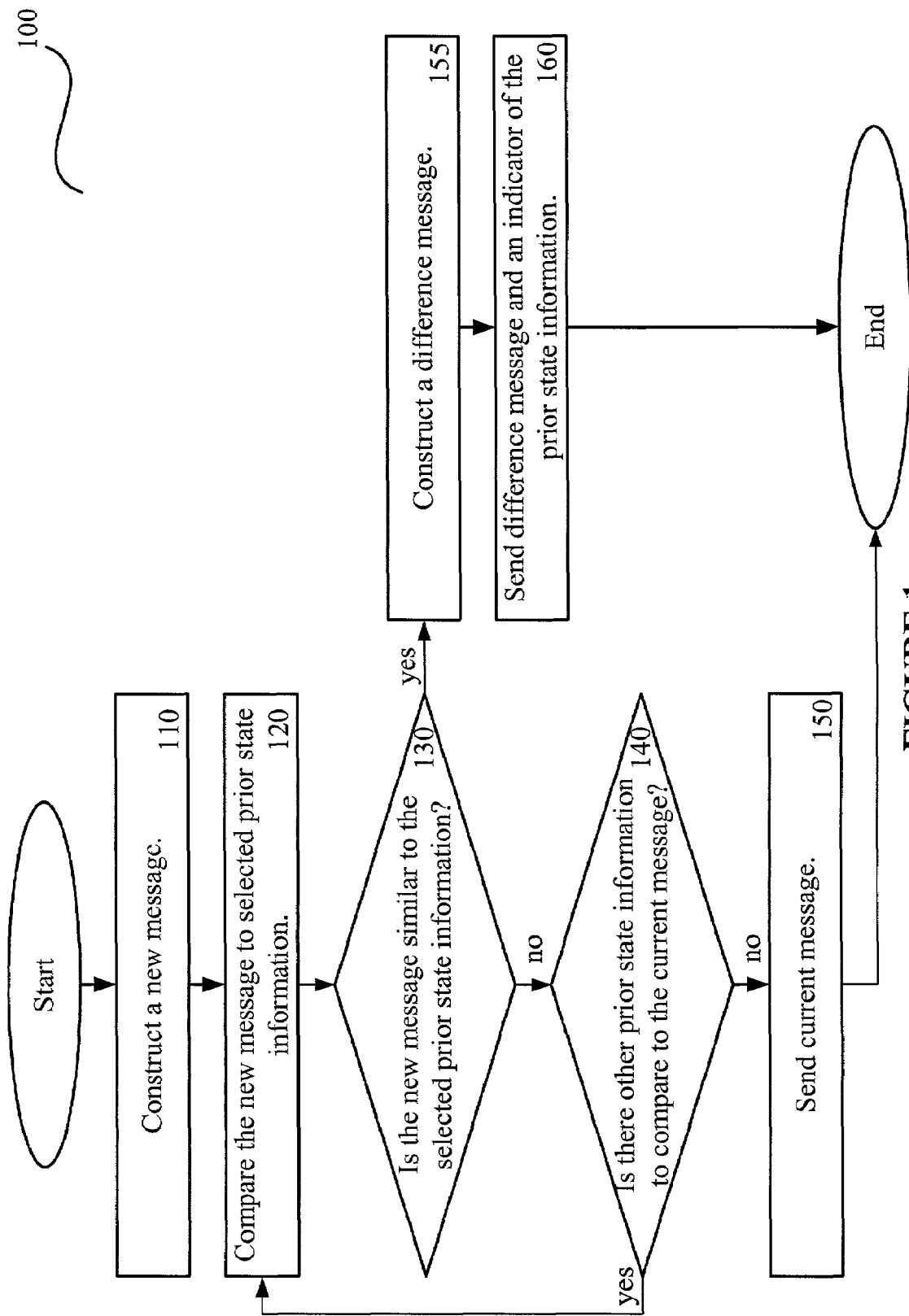
FIG. 1 illustrates a flow diagram of the sender's procedure to send a message according to at least one embodiment of the invention.

FIG. 1 is a flowchart illustrating one embodiment of a process executed at a sending party to encode a difference message. As shown in FIG. 1, the sending party's procedure 100 begins at block 110, where a new message is constructed. As used herein, a new message connotes a message that the sender desires to send to one or more receivers. In one embodiment, the new message comprises a message identifier, one or more target receivers, and a data format for specifying a number of arguments. The data format identifies the presentation of the arguments in the message. The arguments may identify any type of data, such as text, table entries, commands, and other data. Embodiments of data formats used in messaging are described in further detail in reference to FIG. 4 and FIG. 5.

At block 120 (FIG. 1), the process compares the data format and arguments of the new message with prior state information shared with the target receiver. In general, the prior state information may comprise any information accessible to the receiver party. In one embodiment, the prior state information may comprise a message previously sent to the target receiver (referred herein as a prior message). In another embodiment, the prior state information may comprise a previous argument in a new message. At block 130, the process determines whether the new message is similar to selected prior state information (i.e., the new message has at least a portion of the same data format and some of the data format in the prior state information is contained in the new message). If the new message is similar to the selected prior state information (e.g., a prior message), the procedure jumps back to block 155. If the new message does not contain prior state information, the procedure further selects, if available, additional prior state information, such as another prior message for comparison with the new message. If additional prior state information is available, the procedure returns to block 120. If additional prior state information is not available for comparison, the procedure continues to block 150. At block 150, the new message is sent to the target receiver, and the procedure ends.

At block 155, a difference message is constructed from the new message and the selected prior state information. In one embodiment, the difference message also includes an identifier of the prior state information ("prior state information identifier") as well as information that specifies the difference between the contents of the new message and the contents of the identified prior state information. In another embodiment, the receiver automatically selects the last message sent by the sender as the prior state information. Embodiments of data formats and structures for difference messages are described in further detail with reference to FIG. 4. At block 160, the difference message is sent from the sender party to the receiver party, and the procedure ends.

Figure 2:
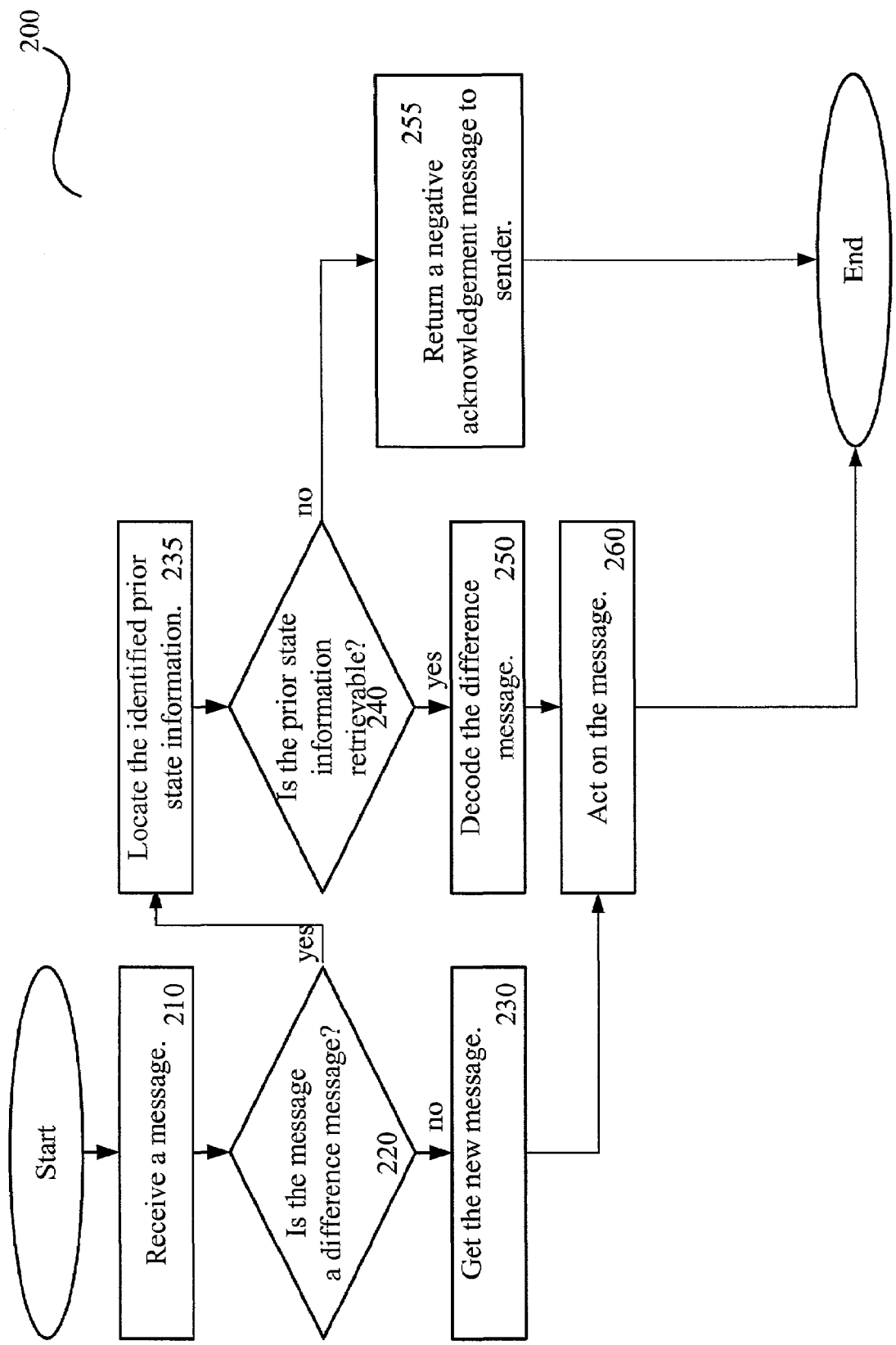
FIG. 2 illustrates a flow diagram of the receiver's procedure to receive a message according to at least one embodiment of the invention.

FIG. 2 is a flowchart illustrating one embodiment for a receiver party that utilizes the messaging techniques of the present invention. As shown in FIG. 2, the receiver party's procedure (200) begins at block 210 when a message from a sender is received at the receiver. At block 220, the process determines whether the message is a new message or a difference message. In one embodiment, to identify a difference message, the process determines if a prior state information identifier is located in the message (e.g., header of the message or stream of the message). In other embodiments, predetermined rules indicate whether the message is a difference message. If so, the message is identified as a difference message, and the procedure continues to block 235. If a prior state information identifier is not found in the message, then the new message does not require "decoding", and the receiver acts on the message (i.e., the receiver processes the new message depending upon the software application) (block 230).

At block 235, the receiver retrieves the prior state information indicated by the prior state information identifier or other means. If the prior state information is successfully retrieved, (checked at block 240), then the procedure continues to block 250. At block 250, the difference message is decoded using the retrieved prior state information in order to reconstruct the new message at the receiver. The new message is processed in accordance with application software. If the prior state information is not successfully retrieved, then the procedure jumps to block 255. At block 255, the receiver constructs a negative acknowledgement message and returns it to the sender. In one embodiment, the negative acknowledgement message includes a negative acknowledgement identifier, an identification of the received message, a notice of failure to reconstruct the new message, and a request for prior state information (e.g., the prior state information needed to re-construct the message) or a request for additional information about the prior state information. The procedure ends upon sending the negative acknowledgement message.

Figure 3:
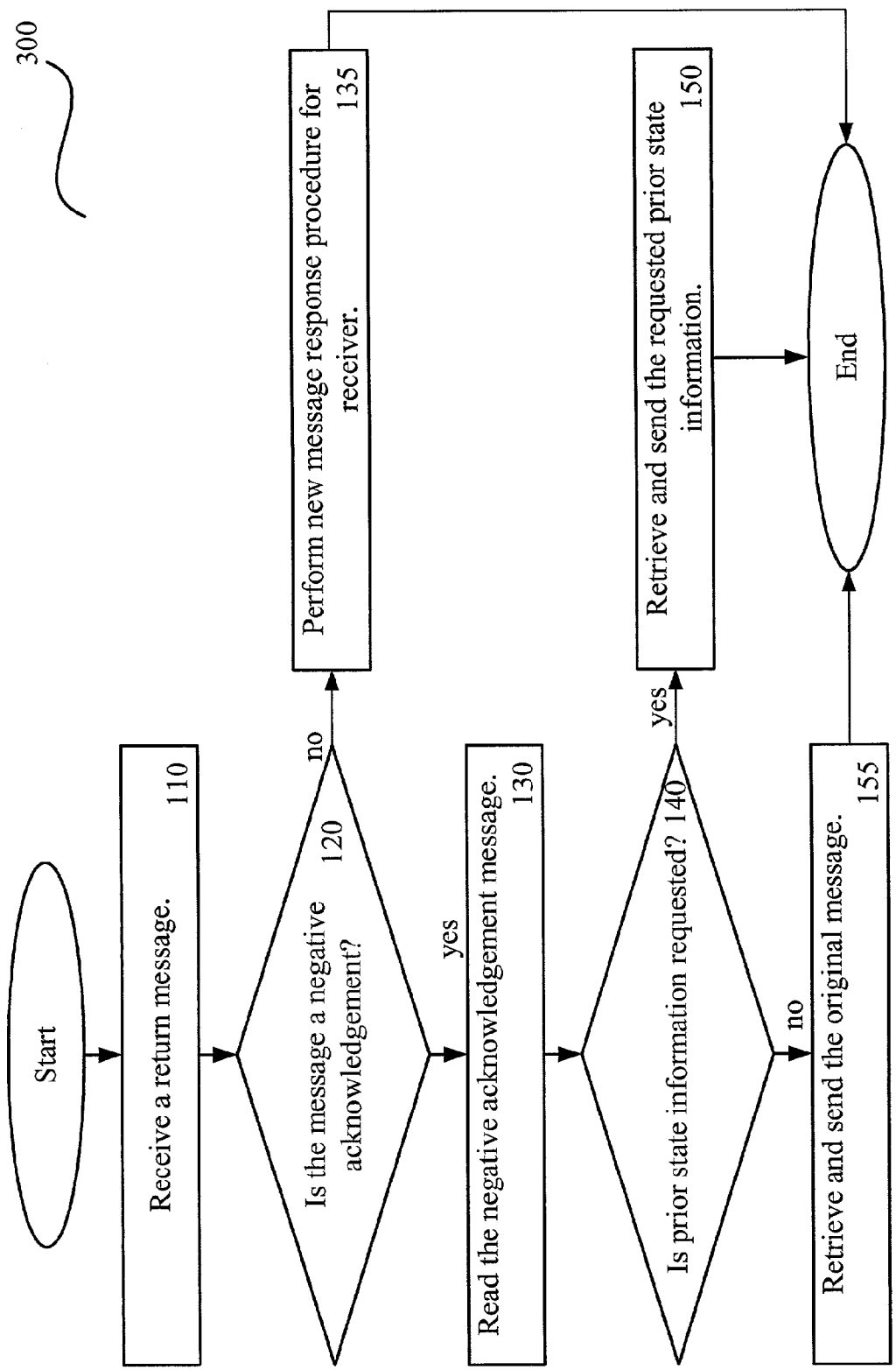
FIG. 3 illustrates a flow diagram of the sender's procedure to respond to a message returned from the receiver.

FIG. 3 is a flowchart illustrating one embodiment for processing negative acknowledgement messages at the sender party. As shown in FIG. 3, process 300 begins at block 310 when a message containing a negative acknowledgement is received at the sender. At block 320, the process determines whether the message received is either a negative acknowledgement message or a new message (i.e., a negative acknowledgement of a message previously sent by the sender or a new message sent by the receiver). In one embodiment, the message is identified as a new message unless a negative acknowledgement identifier is contained in the message. If the message is a new message, the procedure jumps to block 335, where the procedure for a new message at a receiver is executed (procedure 200, FIG. 2) (i.e., the original sending party is now the receiving party for the new message). If the message contains a negative acknowledgement identifier, the procedure continues to block 330.

At block 330, the sender party reads the negative acknowledgement to determine the information required by the receiver in order to decode the difference message. At block 340, if the negative acknowledgement message indicates additional prior state information necessary to decode the difference message, the procedure continues to block 350. If the negative acknowledgement message does not indicate the additional prior state information required to decode the difference message, the procedure continues to block 355. At block 350, the required additional prior state information is retrieved, and sent from the sender to the receiver, and the procedure ends. At block 355, the new message (i.e., original unencoded message) is retrieved, and sent from the sender to the receiver, and the procedure ends.

Difference Messaging:

The various embodiments of the present invention's difference messaging procedures may be applied to a wide variety of messages, data structures and data formats. In some embodiments, a difference message is constructed from a new message and prior state information. As used herein, a "new message" refers to the content of a message that the sender desires to send to a receiver. FIGS. 4A–4D illustrate examples for difference messaging of the present invention. For the example shown in FIGS. 4A–4D, the example difference message includes: (1) a current message

Figure 4A:
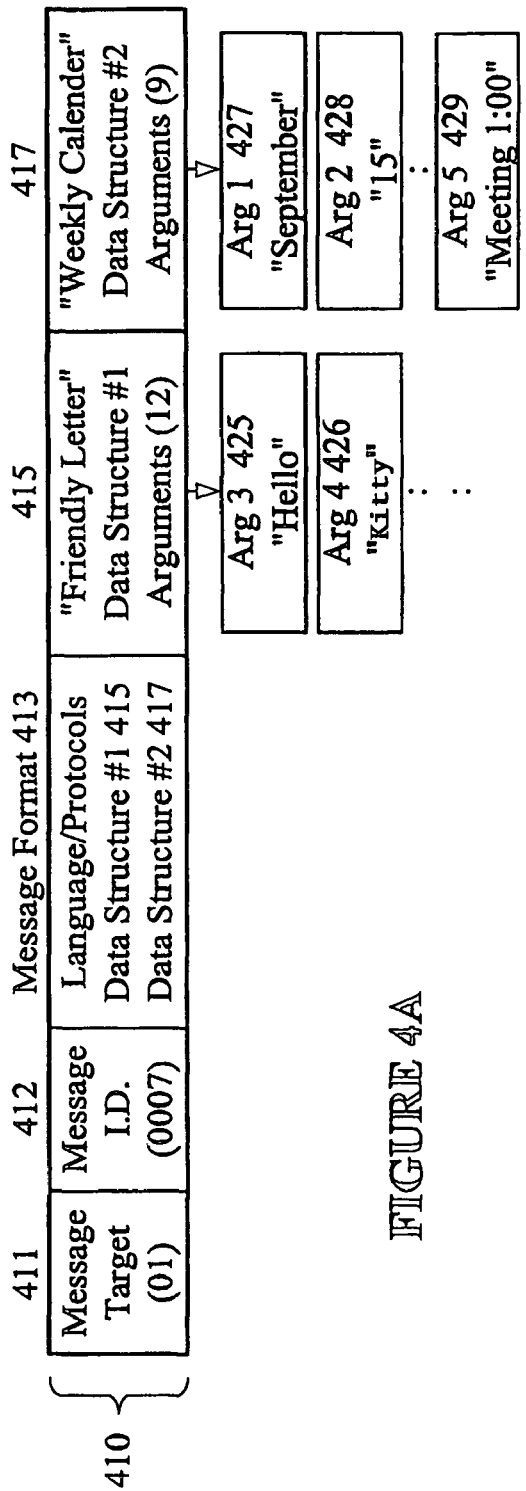
FIG. 4 illustrates embodiments of new and difference messages.
Figure 4B:
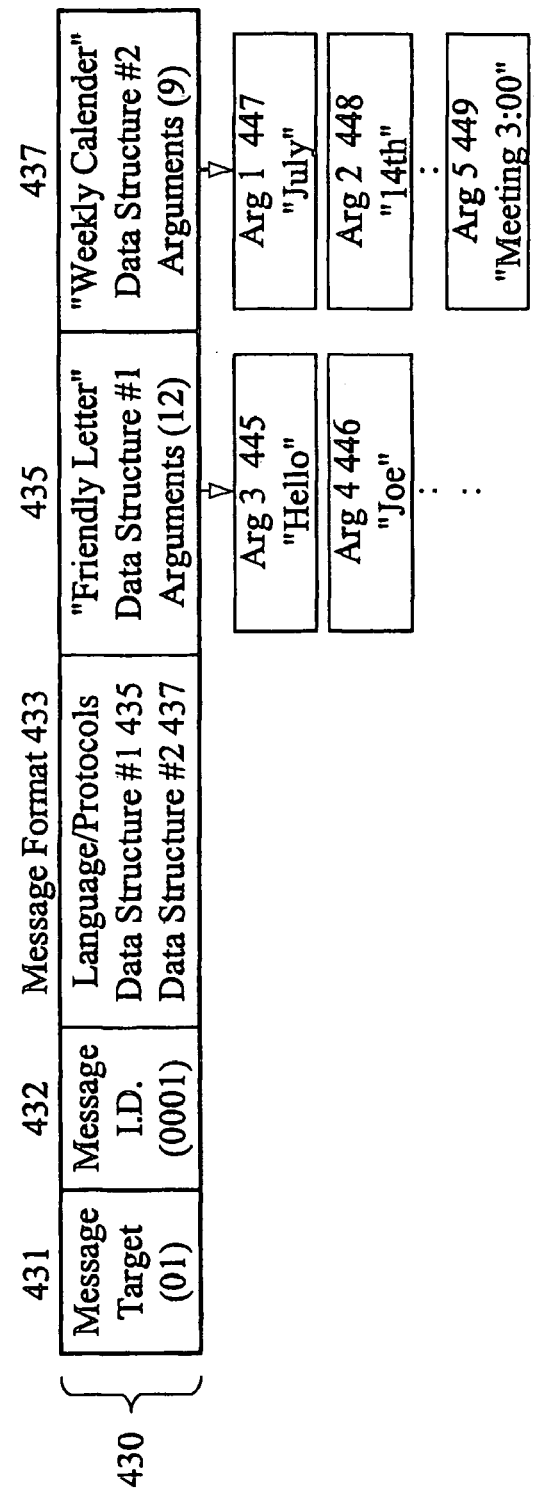

410 (FIG. 4A); (2) a first prior message 430 (FIG. 4B); (3) a second prior message 450 (FIG. 4C); and (4) a difference message 470 (FIG. 4D).

For the examples of FIG. 4A–4D, the messages (410, 430, 450, and 470) comprise a message target (411, 431, 451, and 471), a message identifier (412, 432, 452 and 471) a message format (413, 433, 453, and 473), and one or more data structures (415, 417, 435, 437, 455, 457, 475 and 477). The data structures have one or more arguments associated with them. For example, data structure 455 of message 450 includes two arguments (i.e., Arg 1 465 and Arg 2 466). The message target includes an identifier for the intended receiver or receivers. The message target may comprise an email address, a telephone number, a device ID internal to a computer processor, or other destinations across a communication channel. The message identifier uniquely identifies the message for future reference as prior state information. The message identifier may comprise a user-defined name, a date and time of day, a sequence message number, or other unique identifier information. The message format includes information about the data in the message. The message format may include data type, format and an order for the data structures and data arguments of the message. In one embodiment, the message format may comprise a computing language, transport protocols, and an ordered list of the data structures included in the message. Each data structure (e.g., 415 and 417) includes information about the data format and arguments.

For the example message 410 of FIG. 4A, the message target 411 is "01", the message ID 412 is "0007", and the message format 413 includes data structure #1 (415) and data structure #2 (417). For the example of FIG. 4A, the ordered list of data structures may include, for example, a "friendly letter" data structure 415 and a "weekly calendar" data structure 417. For example, the "friendly letter" data structure 415 comprises formatting information to display a written letter and the attachments defined by 12 arguments. The data structure 415 includes twelve (12) arguments, including Argument "1" 425 and Argument "2" 426. Specifically, the arguments include: a first argument, "Arg 1", to define a sender's information header; a second argument, "Arg 2", to define a date, a third argument; "Arg 3", to define a greeting 425; a fourth argument, "Arg 4", to define a list of letter recipient names 426; a fifth argument, "Arg 5", to define a text string for the body of the letter, a sixth argument, "Arg 6", to define a sign-off; and six additional arguments, "Arg 7"–"Arg 12", to define images, data files, or other information in selected data formats. The data structure 417 includes nine (9) arguments (e.g., Argument "1" 427, Argument "2" 428, and Argument "4" 429). Specifically, the example "weekly calendar" data structure 417 includes fields for a weekly calendar of events defined by 9 arguments. The arguments include: "Arg 1" that defines a field for a month 427, "Arg 2" 428 that defines a field for the date; and "Arg 3"–"Arg 9" that define fields for listing events on each day of the week, Sunday through Saturday.

The first prior message 430, shown in FIG. 4B, similarly comprises a message target 431, a message identifier 432, a message format 433, a "friendly letter" data structure 435, and a "weekly calendar" data structure 437. The "friendly letter" data structure 435 includes fields for arguments 445, and 446, and the "weekly calendar" data structure 437 includes fields for arguments 447, 448, and 449.

Figure 4C:
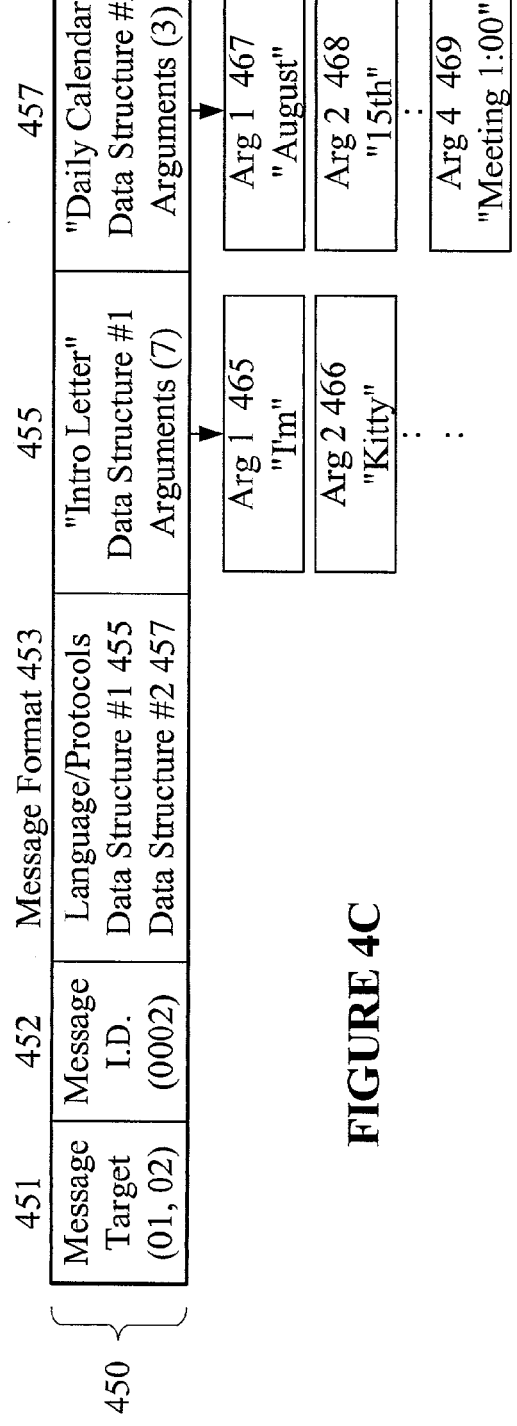
Figure 4D:
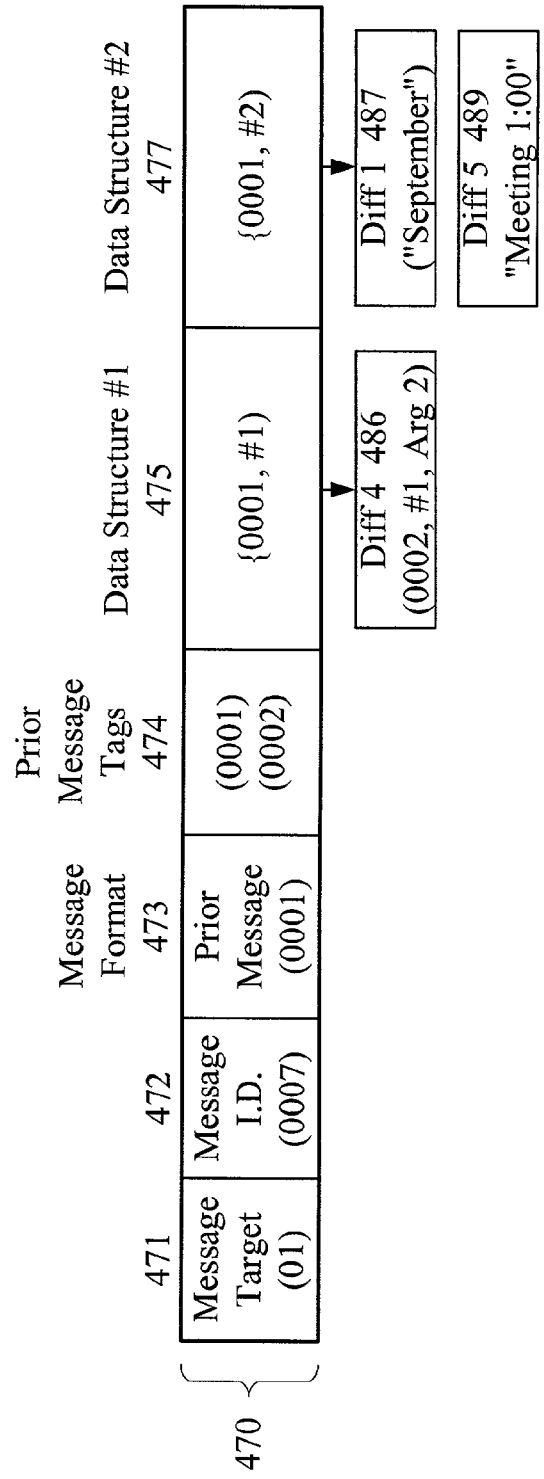

The second prior message 450, shown in FIG. 4C, similarly comprises a message target 451, a message identifier 452, and a message format 453. The second prior message also includes an "intro letter" data structure 455, a "daily calendar" data structure 457, "intro letter" arguments (e.g., 465 and 466), and "daily calendar" arguments (e.g., 467, 468, and 469).

The difference message 470, shown in FIG. 4D, also comprises a message target 471, a message identifier 472, and a message format 473. In addition, the difference message 470 includes prior message tags 474 and prior message data structure tags 475 and 477. The prior message tags identify prior state information or prior messages that are necessary to reconstruct the current message. For the example in FIG. 4D, the prior message tags 474 identify, as a prior messages, the first prior message, "Message ID 0001", and the second prior message, "Message ID 0002". The prior message data structure tags (e.g., 475 and 477) specify a data structure for the difference message. For the examples of FIGS. 4A and 4D, the prior message data structure tags identify data structures from the prior messages 430 and 450 that are used in the difference message 470. Specifically, for this example, the data structure tag (0001, #1) 475 references data structure #1 "weekly calendar" 435 of prior message "Message ID 0001" 430 for the first data structure of difference message 470. The data structure tag (0001, #2) 477 identifies the format of data structure #2 by referencing "friendly letter" data structure 437 of prior message "Message ID 0001" 430.

In one embodiment for difference messages, the prior argument tags (e.g., 486 and 487 in FIG. 4D) identify the arguments of each data structure in the current message that are different than those of the corresponding data structure of the prior message(s) (i.e., the prior message and corresponding data structures for those prior messages are referenced in the prior messages field 474 and data structures field 475 and 477, respectively). For the examples of FIGS. 4A–4D, argument tag "Diff 4" 486 references Arg 2 466 of data structure #1 455 in prior message "Message ID 0002" 450. Prior argument tag "Diff 1 487 references "September".

One embodiment of constructing a difference message 470 proceeds as follows. As described in reference to FIG. 1, current message 410 is determined to be similar to prior message "Message ID 0001" (430). Difference message 470 is then constructed using the current message 410 and prior messages sent to the message target (e.g., "Receiver 01"). For this example, prior messages include the prior message "Message ID 0001" (430) and the prior message "Message ID 0002" (450). The new message ID 0007 (472) and the prior message IDs of the requisite prior messages (430 and 450) are identified in the difference message 470 (474). In essence, the difference message is defined, in message format 473, as being similar to that of prior message, "Message ID 0001" (430). Thus, the current message, as encoded in the difference message 470, includes a "Friendly Letter" data structure #1 435 and a "Weekly Calendar" data structure #2 437. Data structure #1 475 in difference message 470 is defined by reference to data structure #1 435 of prior message "Message 0001" 430 to include 12 arguments. The data for each argument of data structure #1 475 is the same as the corresponding argument in data structure #1 435, except for arg 2. When an argument of data structure #1 415 of current message 410 is different than the corresponding argument of data structure #1 of a prior message (e.g., 430), an argument tag defining a difference argument is included in difference message 470. For the difference message 470 example, the argument tags (486 and 487) define differences between the arguments of new message 410 and prior message "Message 0001" 430.

One embodiment of reconstructing the current message 410 from the difference message 470 and the prior messages 430 and 450 is as follows. As described in reference to FIG. 2, difference message 470 is received at the receiver, and the receiver determines, from the prior message tags 474, that the message is a difference message. Prior messages "Message ID 0001" (430) and "Message ID 0002" (450) are retrieved, and are used in conjunction with difference message 470 to reconstruct the current message 410. First, the message format of the current message 410 is determined, from the message format field 473, to be identical to the message format of prior message "Message ID 0001" (430). Thus, as a starting point, the prior message 430 has a "friendly letter" data structure with a greeting, as an argument, "Hello All." Also, as a starting point, the prior message 450 has a "daily calendar" data structure with "August", as an argument. Using the difference message 470, the receiver replaces the data in Arg 4 of "friendly letter" data structure with argument, "Kitty", and replaces the data in Arg 1 of "weekly calendar" data structure with the argument "September." The greeting reconstructed from difference message 470 now correctly reads "Hello Kitty", and is the same as the current message 410. Similarly, the weekly calendar fields reconstructed from difference message 470 now correctly reads read "September 14" and "meeting at 1:00."

Figure 5:
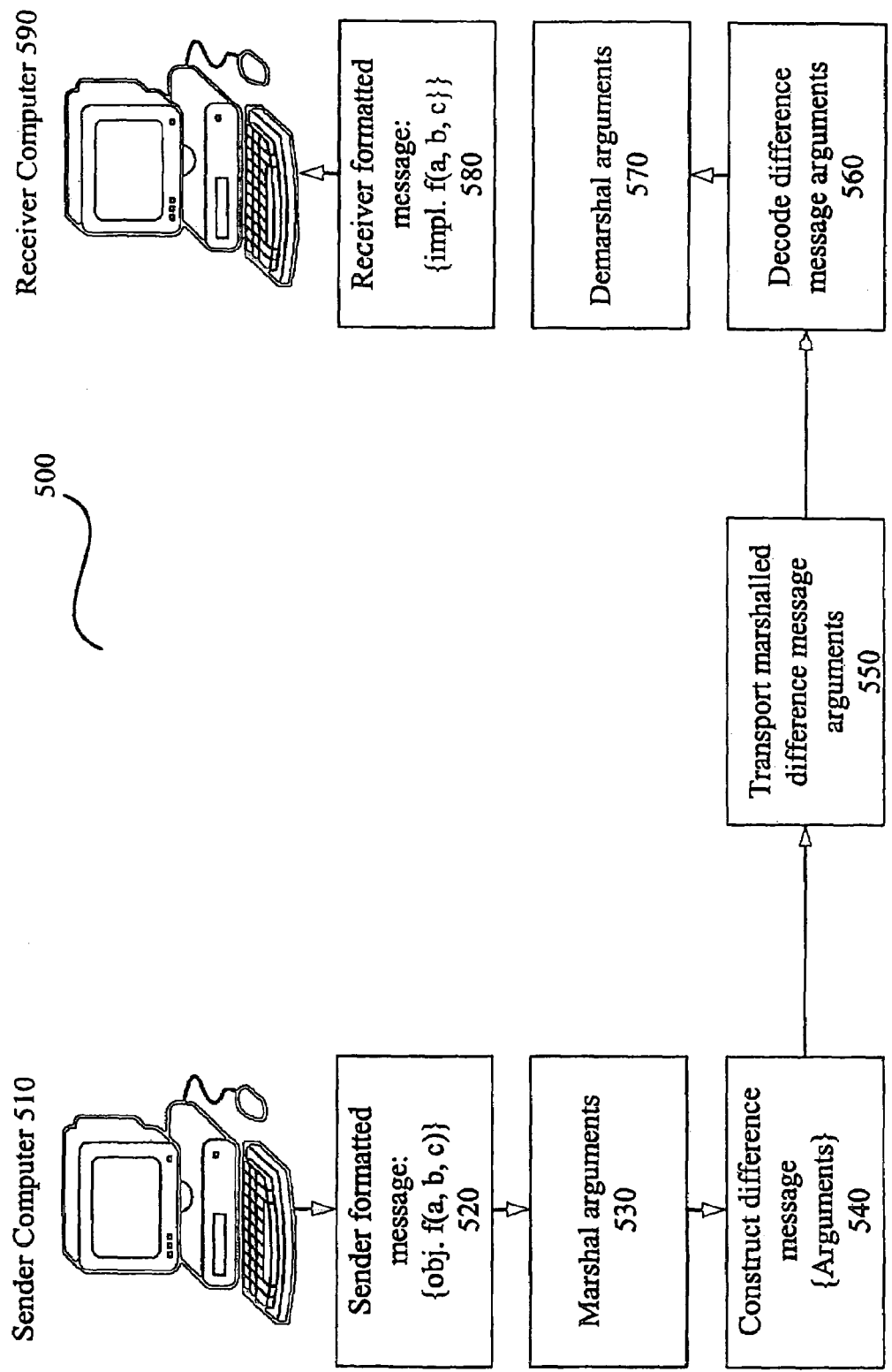
FIG. 5 illustrates sending a difference message in a computer environment, according to at least one embodiment of the invention.

Difference Messaging Systems:

Embodiments of the invention's high throughput messaging method may be applied to many types of message objects, across various communication channels. One embodiment of implementing the invention's difference messaging system is through multiple computers. FIG. 5 illustrates one embodiment for implementing a difference messaging system. As shown in FIG. 5, the system includes a sender computer 510. The sender computer 510 includes computer hardware and software for formatting a current message, as shown in block 520. The message includes {obj, "f", arguments}. At block 530, the formatting, functionality and arguments of the message object are marshaled into a device independent "new list of arguments" in a transmittable form. The sender computer 510 "marshals" or "serializes" the data in the message so as to generate a format independent data set 530. In general, the process to serialize or to marshal involves separating the fields or members of the message in a serial manner. For the example of FIG. 4A, the arguments of the "friendly letter" data structure are separated. The serialization permits comparison among messages on a field-by-field or argument-by-argument basis. For example, by serializing a data structure in a message, a single argument of a first message may be compared to a single argument of a second message, even though the arguments were initially formatted in a data structure with multiple arguments of different data types and sizes. The sender computer 510 constructs the difference message (block 540). Specifically, a device independent "difference list of arguments" is formed using the marshaled "new list of arguments" and a similar "prior list of arguments." Using the serialized data, the sender computer compares each field of the current message with each field of the prior messages or prior state information to determine the difference between the messages. At block 550, the "difference list of arguments" is transported to the receiver or receivers. The difference message is transported between the sender computer 510 and the receiver computer 590 over a communications link, such as a public or private network.

The general message object {obj, f(a, b, c)} is recovered at the receiver computer 590 as follows. At block 560, each receiver receives the "difference list of arguments". The receiver determines from the arguments that the message is a "difference list of arguments" and retrieves the necessary "prior list of arguments". The receiver then decodes the "difference list of arguments" to reconstruct the device independent "new list of arguments". At block 570, the device independent "new list of arguments" is then demarshalled according to the specific formatting and protocols of the receiver. For example, if an argument is a portion of a data structure, then the argument and its associated data are populated in the data structure. Thus, the device independent "new list of arguments" may be demarshalled differently for various receivers, to form receiver formatted new message implementation objects {impl. f(a, b, c)} 580 at each receiver computer 590.

The high throughput messaging system describe herein has several advantages over the prior art. This messaging system is applicable to a wide range of distributed networks employing different data structures and data formats. For example, the present invention has application for use in object-oriented systems to query the status of a device whose parameters change very little.

A system utilizing the present invention transmits the data from a sender to a receiver with high throughput and without loss of any of the information included in the message. In case of a transmission error, the system further enables messages to be resent in compressed or full resolution format. The system increases message transmission speed and reduces the required communication bandwidth of the network. In addition, the messaging system does not require the application programs operating on the sender and receiver computers to possess any knowledge of the difference messaging system. This permits a sender and receiver computer to elect whether to use the difference messaging system. For example, a server may send to a client referential messages without any modification of the application programs operating on the server. For this embodiment, the messaging system is software operating one the sender and receiver computers, and the messaging software runs independent of the application programs on the sender and receiver computers.

The foregoing has described a new method and apparatus for high throughput messaging. Although the invention is described with respect to a preferred embodiment, modifications thereto will be apparent to those skilled in the art. It is contemplated that changes and modifications may be made to the materials and arrangements of elements of the present invention without departing from the scope of the invention. Therefore, the scope of the invention is to be determined by reference to the claims that follow.

What is claimed is:

1. A method of sending a message to a recipient, comprising:

obtaining a new message to be transmitted to a recipient;

comparing the new message to at least one message previously transmitted to the recipient;

constructing a difference message that includes identification information identifying an earlier message previously transmitted to the recipient and difference information specifying a difference between the new message and at least a portion of the earlier message; and transmitting the difference message to the recipient, wherein the identification information also identifies a second message that was previously transmitted to the recipient.

2. A method according to claim 1, wherein the difference message further includes message subset information that identifies a subset of the earlier message and wherein the difference information specifies a difference between the new message and the identified subset of the earlier message.

3. A method according to claim 2, wherein the message subset information includes an identification of a data structure identified in the earlier message.

4. A method according to claim 3, wherein the difference information sets forth a modification of a data value for an argument of the data structure.

5. A method according to claim 1, wherein the identification information includes a code that uniquely identifies the earlier message.

6. A method according to claim 1, wherein the difference information references content that was identified in the second message.

7. A method according to claim 6, wherein the difference information indicates that the referenced content is to be inserted into an indicated field in the new message.

8. A method according to claim 1, wherein the comparing step comprises comparing a data format and a corresponding argument of the new message with at least one data format and corresponding argument in the at least one message previously transmitted to the recipient.

9. A method according to claim 1, wherein the comparing step selects the earlier message upon determining that the new message is similar to the earlier message.

10. A method according to claim 1, wherein the comparing step selects the earlier message upon determining that the new message has at least a portion of the same data format and some of the same data as the earlier message.

* * * * *

UNITED STATES PATENT AND TRADEMARK OFFICE
CERTIFICATE OF CORRECTION

PATENT NO. : 7,065,137 B2  Page 1 of 3
APPLICATION NO. : 10/056659
DATED : June 20, 2006
INVENTOR(S) : Keith E. Moore et al.

It is certified that error appears in the above-identified patent and that said Letters Patent is hereby corrected as shown below:

On sheet 3 of 6, delete

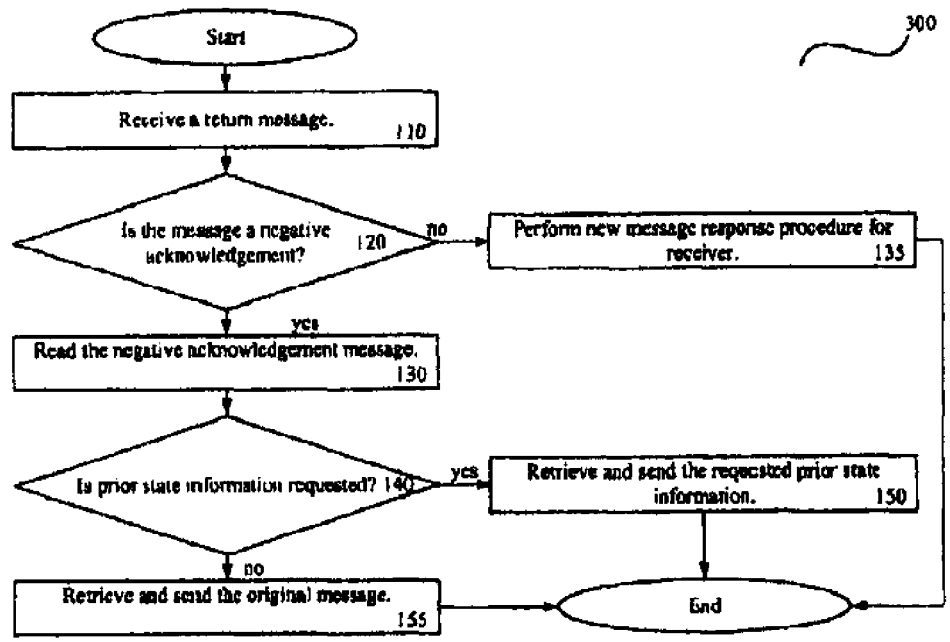

"  FIGURE 3  " and

UNITED STATES PATENT AND TRADEMARK OFFICE
CERTIFICATE OF CORRECTION

PATENT NO. : 7,065,137 B2  Page 2 of 3
APPLICATION NO. : 10/056659
DATED : June 20, 2006
INVENTOR(S) : Keith E. Moore et al.

It is certified that error appears in the above-identified patent and that said Letters Patent is hereby corrected as shown below:

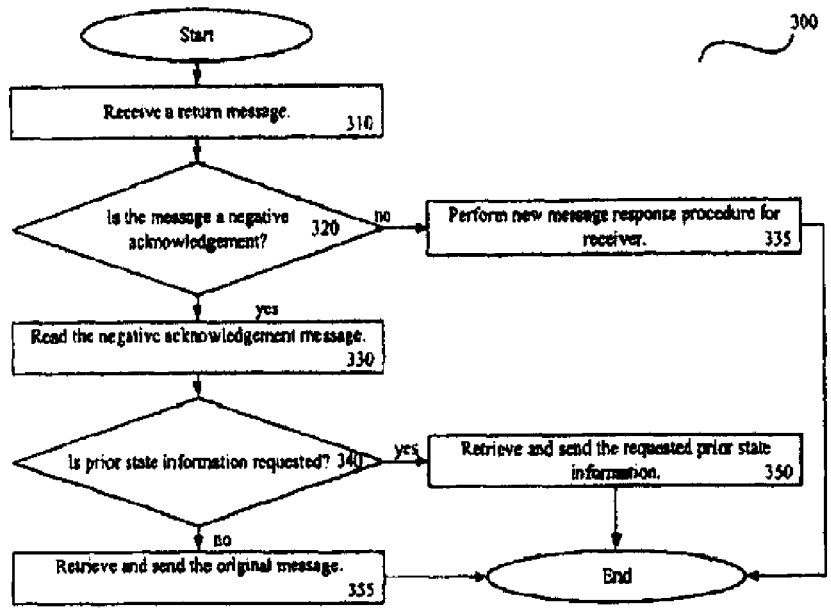

insert --                           FIGURE 3                           --, therefor.

UNITED STATES PATENT AND TRADEMARK OFFICE
CERTIFICATE OF CORRECTION

PATENT NO.         : 7,065,137 B2
APPLICATION NO.    : 10/056659
DATED              : June 20, 2006
INVENTOR(S)        : Keith E. Moore et al.

It is certified that error appears in the above-identified patent and that said Letters Patent is hereby corrected as shown below:

In column 2, line 14, after "message" delete "to".

In column 6, line 22, after "The data" delete "to".

In column 7, line 23, after "correctly" delete "reads".

Signed and Sealed this

Second Day of June, 2009

JOHN DOLL
*Acting Director of the United States Patent and Trademark Office*